(12) United States Patent
Zang et al.

(10) Patent No.: US 9,741,615 B1
(45) Date of Patent: Aug. 22, 2017

(54) CONTACTS FOR A FIN-TYPE FIELD-EFFECT TRANSISTOR

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/242,951

(22) Filed: Aug. 22, 2016

(51) Int. Cl.
| | | |
|---|---|---|
| H01L 23/48 | (2006.01) | |
| H01L 21/768 | (2006.01) | |
| H01L 21/8234 | (2006.01) | |
| H01L 21/311 | (2006.01) | |
| H01L 27/088 | (2006.01) | |
| H01L 29/78 | (2006.01) | |
| H01L 23/532 | (2006.01) | |
| H01L 23/528 | (2006.01) | |

(52) U.S. Cl.
CPC .. *H01L 21/76897* (2013.01); *H01L 21/31144* (2013.01); *H01L 21/823431* (2013.01); *H01L 21/823468* (2013.01); *H01L 21/823475* (2013.01); *H01L 23/5283* (2013.01); *H01L 23/53209* (2013.01); *H01L 27/0886* (2013.01); *H01L 29/785* (2013.01)

(58) Field of Classification Search
CPC ....... H01L 21/31144; H01L 21/823431; H01L 21/823468; H01L 21/823475
USPC .......................... 257/774, E23.011, E23.145
See application file for complete search history.

(56) References Cited

U.S. PATENT DOCUMENTS

| | | | | |
|---|---|---|---|---|
| 7,579,278 | B2* | 8/2009 | Sandhu | H01L 21/0332 428/105 |
| 8,772,166 | B2* | 7/2014 | Sandhu | H01L 21/0337 257/E21.038 |
| 8,946,075 | B2 | 2/2015 | Cai et al. | |
| 2016/0233164 | A1* | 8/2016 | Choi | H01L 27/0924 |
| 2016/0343708 | A1* | 11/2016 | Park | H01L 29/66545 |
| 2016/0343825 | A1* | 11/2016 | Bae | H01L 29/665 |
| 2016/0358905 | A1* | 12/2016 | Balakrishnan | H01L 27/0629 |

OTHER PUBLICATIONS

A. Takese, et.al., "Highly selective Si3N4/SiOC etching using dual frequency superimposed RF capacitively coupled plasma", 45(7):5954-5959. JJAP, 2006.

\* cited by examiner

*Primary Examiner* — Tan N Tran
(74) *Attorney, Agent, or Firm* — Thompson Hine LLP

(57) ABSTRACT

Structures for contacting a fin-type field-effect transistor (FinFET) and associated methods. First and second gate structures are formed. The second gate structure is separated from the first gate structure by a space that crosses over a top surface of a fin. At least one layer is formed in the space, and a hardmask layer is formed on the at least one layer. An opening is formed in the hardmask layer at a location that is above the top surface of the fin and that is between the first gate structure and the second gate structure. The at least one layer is etched at the location of the opening to form a contact hole extending through the at least one layer to the top surface of the fin. A contact, which is formed in the contact hole, is coupled with the top surface of the fin.

9 Claims, 8 Drawing Sheets

CONTACTS FOR A FIN-TYPE FIELD-EFFECT TRANSISTOR

BACKGROUND

The present invention relates to semiconductor device fabrication and integrated circuits and, more specifically, to structures for contacting a fin-type field-effect transistor (FinFET) and methods for fabricating a structure for contacting a FinFET.

A FinFET is a non-planar device structure for a field-effect transistor that is capable of being more densely packed in an integrated circuit than planar field-effect transistors. A FinFET includes one or more fins of semiconductor material and an overlapping gate electrode that intersects a channel within each fin. The channel in each fin is located between heavily-doped source/drain regions formed in fin sections that are not covered by the gate electrode. The fin dimensions and the number of fins determine the effective channel width of the FinFET.

Contacts, often referred to as CA contacts, are formed in order to make electrical connections to the source/drain regions of the FinFET. The source/drain regions and their contacts must remain electrically insulated from the gate electrode and its contact in order to ensure the functionality of the FinFET. Otherwise, a short circuit can occur that may damage the FinFET. The CA contacts are typically formed in contact holes that are etched in a interlayer dielectric and, as a result, are surrounded by the insulating material of the interlayer dielectric.

In a self-aligned contact (SAC) process, the contact hole for a CA contact can partially overlap with the gate conductor, which requires the gate conductor to be capped and clad by spacers to avoid shorting. As technology nodes advance, the space available between adjacent gates decreases with decreasing pitch. The decreased spacing increases the difficulty in contacting the source/drain regions without inflicting damage to the gate electrode when etching contact holes in the interlayer dielectric.

SUMMARY

In an embodiment of the invention, a structure includes a fin, a first gate structure associated with the fin, and a second gate structure separated from the first gate structure by a space. A top surface of the fin is located in the space between the first gate structure and the second gate structure. The structure further includes a dielectric layer in the space, and a contact inside a contact hole extending through the dielectric layer. The contact includes a first section connected with the top surface of the fin and a second section connected with the first section. The second section of the contact and the first section of the contact have different widths.

In an embodiment of the invention, a method includes forming a first gate structure and a second gate structure separated from the first gate structure by a space that crosses over a top surface of a fin, forming at least one layer in the space, and forming a hardmask layer on the at least one layer. An opening is formed in the hardmask layer at a location that is above the top surface of the fin and that is between the first gate structure and the second gate structure. The at least one layer is etched at the location of the opening to form a contact hole extending through the at least one layer to the top surface of the fin. A contact, which is formed in the contact hole, is coupled with the top surface of the fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
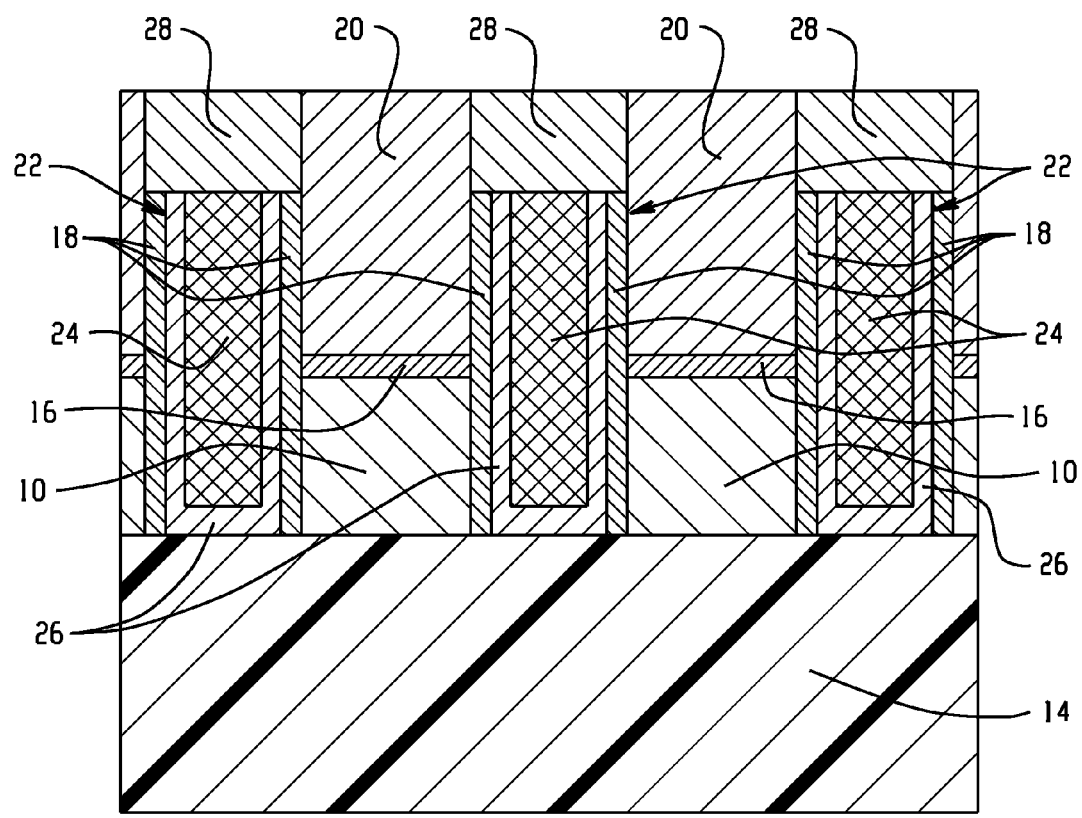
FIGS. 1-7 are cross-sectional views of a portion of a substrate at successive stages of a processing method for forming contacts in accordance with embodiments of the invention.

With reference to FIG. 1 and in accordance with an embodiment of the invention, a fin 10 is formed from a semiconductor material of a substrate 14, which may be a bulk substrate or a device layer of a semiconductor-on-insulator (SOI) substrate. The fin 10 is constituted by a three-dimensional body of semiconductor material. The fin may be formed from the semiconductor material of the substrate 14 by photolithography and etching processes, such as a sidewall imaging transfer (SIT) process. The fin 10 is covered at its top surface by a contact etch stop layer (CESL) 16, which may be constituted by a thin layer of silicon nitride ($Si_3N_4$).

An interlayer dielectric layer 20 may be formed by depositing an electrical insulator and then planarizing the electrical insulator using, for example, chemical mechanical polishing (CMP). The interlayer dielectric layer 20 may be comprised of a dielectric material, such as an oxide of silicon (e.g., silicon dioxide ($SiO_2$)) deposited by chemical vapor deposition (CVD).

Gate structures 22 are located in openings in the interlayer dielectric layer 20. Sidewall spacers 18 line the openings and are located on the vertical sidewalls of the gate structures 22. The sidewall spacers 18 may be comprised of a dielectric material, such as silicon nitride or a low-k dielectric material like silicon oxycarbonitride (SiOCN). Each gate structure 22 includes a gate electrode 24 and a gate dielectric 26 cladding the sidewalls and bottom of each opening in the interlayer dielectric layer 20. The gate electrode 24 may be comprised of a metal, such as aluminum or tungsten, deposited by physical vapor deposition (PVD), CVD, etc., and may also include one or more work function metal layers present to adjust the threshold voltage. The gate dielectric 26 may be comprised of a dielectric or insulating material, such as a high-k dielectric material such as hafnium oxide or hafnium oxynitride, deposited by CVD, atomic layer deposition (ALD), etc. The gate structures 22 may be formed by depositing layers of the constituent materials of the gate electrode 24 and gate dielectric 26, and removing the deposited layers from the field area by planarization, such as with CMP.

Caps 28 are located on the respective top surfaces of the gate structures 22. The caps 28 may be comprised of a dielectric material, such as silicon nitride ($Si_3N_4$) or silicon oxycarbonitride (SiOCN) deposited by CVD. The material constituting the interlayer dielectric layer 20 may be chosen to etch selective to the constituent material of the caps 28, as well as the material constituting the sidewall spacers 18.

Figure 2:
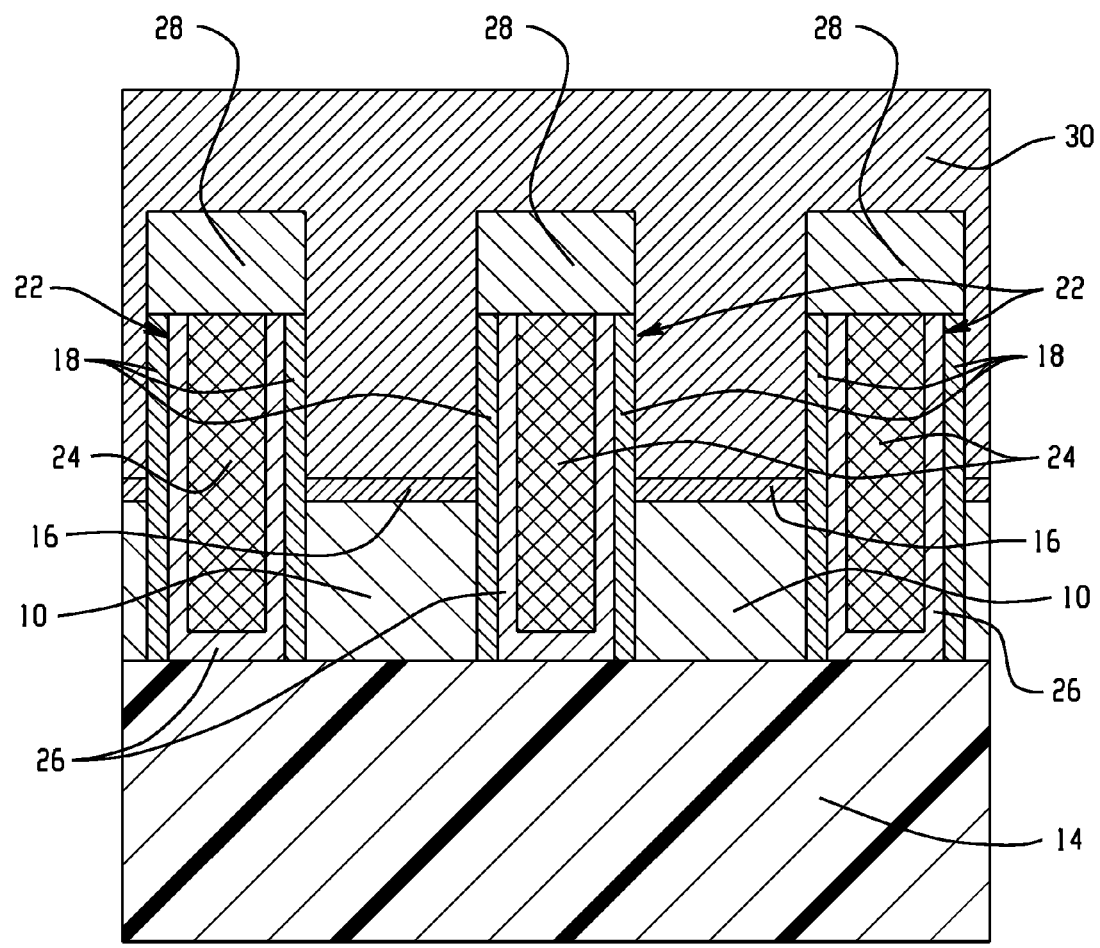

With reference to FIG. 2 in which like reference numerals refer to like features in FIG. 1 and at a subsequent fabrication stage, the interlayer dielectric layer 20 (FIG. 1) is removed using, for example, a selective etch-back process. The sidewall spacers 18 and caps 28 protect the gate structures 22 and the CESL 16 protects the top surface of the fin 10 against damage from the etchant used in the etch-back process removing the interlayer dielectric layer 20. For example, the interlayer dielectric layer 20, if composed of silicon dioxide, may be removed using a wet chemical etch with a hydrofluoric acid solution as an etchant. The gate structures 22 project vertically above the top surface of the fin 10 and gaps are defined in the spaces between the gate structures 22 from which the interlayer dielectric layer 20 is removed and in which the top surface of the fin 10 is exposed.

Following the removal of interlayer dielectric layer 20, a sacrificial layer 30 is formed to fill the gaps between the gate structures 22 vacated by the interlayer dielectric layer 20 and the sacrificial layer 30 is subsequently planarized. The sacrificial layer 30 covers the top surface of the fin 10, and extends from the sidewall spacer 18 on one gate structure 22 to the sidewall spacer 18 on the adjacent gate structure 22 across each gap. The sacrificial layer 30 may be comprised, for example, of a layer of an organic planarization layer (OPL) applied by a spin coating process. Alternatively, the sacrificial layer 30 may be comprised of amorphous silicon deposited using plasma-enhanced chemical vapor deposition (PECVD) or low-pressure chemical vapor deposition (LP-CVD). As used herein, a sacrificial structure is a structure that is present at a juncture of the fabrication process flow, but is removed in its entirety later in the fabrication process flow and is absent from the completed structure.

Figure 3:
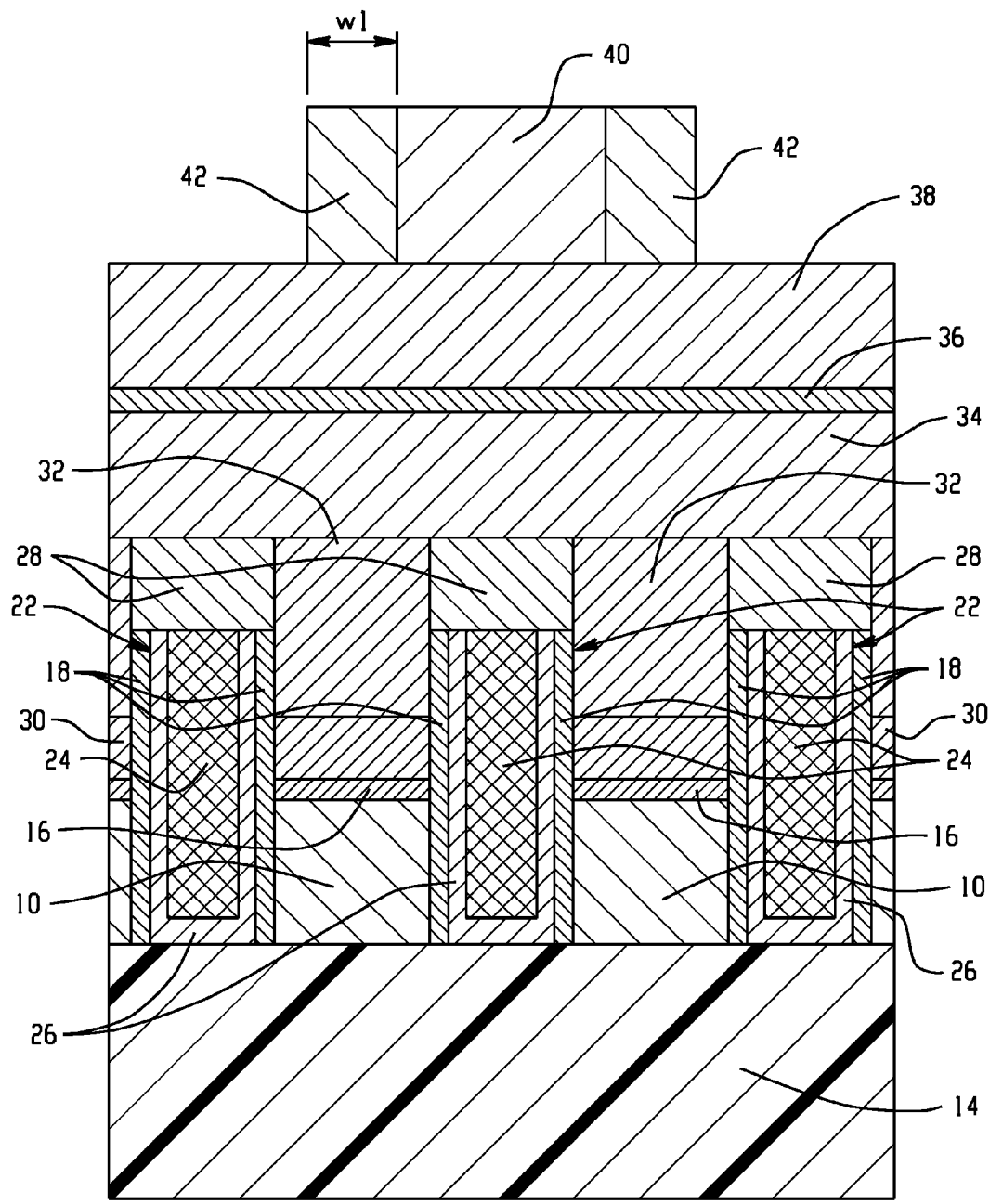

With reference to FIG. 3 in which like reference numerals refer to like features in FIG. 2 and at a subsequent fabrication stage, the sacrificial layer 30 is recessed relative to the gate structures 22 and partially removed using CMP and/or etching with a suitable etch-back process. The etch-back process is halted after the sacrificial layer 30 is thinned and before the sacrificial layer 30 is completely removed. As a result, portions of the recessed sacrificial layer 30 remain located in the gaps between adjacent pairs of the gate structures 22 and retain a given thickness above the top surface of the fin 10. The thickness of the sacrificial layer 30 relative to the top surface of the fins 10 is less than the height of the gate structures 22 relative to the same positional reference such that the gate structures 22 project above the sacrificial layer 30.

A dielectric layer 32 is deposited and planarized stopping on the caps 28 on the gate structures 22 using, for example, CMP. The dielectric layer 32 may be an electrical insulator and serves to completely re-fill the gaps between the gate structures 22 after the sacrificial layer 30 is recessed. A composite of layers 30, 32 fills each gap or space between an adjacent pair of gate structures 22 with the sacrificial layer 30 located between the dielectric layer 32 and the top surface of the fin 10. The material constituting the dielectric layer 32 is selected such that it may be selectively etched relative to the material of sacrificial layer 30 later. For example, in an embodiment, the dielectric layer 32 may be silicon dioxide ($SiO_2$). As used herein, the term "selective" in reference to a material removal process (e.g., etching) denotes that the material removal rate (e.g., etch rate) for the targeted material is higher than the removal rate for at least another material exposed to the material removal process.

Hardmask layers 34, 36, 38 are sequentially formed as a layer stack on the planarized top surface of dielectric layer 32. The materials forming the hardmask layers 34, 36, 38 may be selected to be readily removed by, for example, etching at a subsequent fabrication stage. The hardmask layers 34, 38 may be composed of, for example, silicon dioxide ($SiO_2$) deposited by CVD. The hardmask layer 36 may be composed of, for example, silicon nitride ($Si_3N_4$) deposited by CVD.

A mandrel 40 is formed on a top surface of the hardmask layer 38 by patterning a layer of sacrificial material, such as amorphous silicon or amorphous carbon. The mandrel 40 may have a rectangular shape with corners. A spacer 42 is then formed on the vertical sidewalls of the mandrel 40, and extends about the exterior of the mandrel 40 adopting the shape of the outer perimeter of the mandrel 40 including the corners. The mandrel 40 is located on the top surface of the hardmask layer 38 such that the spacer 42 crosses over the top surface of the fin 10 at locations that are respectively aligned with the gaps between adjacent gate structures 22. The spacer 42 may be formed by depositing a conformal layer comprised of a dielectric material, such as a conformal layer of silicon nitride ($Si_3N_4$) deposited by CVD, and shaping the conformal layer with an anisotropic etching process, such as reactive ion etching, that preferentially removes the dielectric material from horizontal surfaces.

The spacer 42 has a dimension, w1, that is related to the thickness of the deposited conformal layer and that may be equal to the thickness of the deposited conformal layer. The sections of the spacer 42 on different vertical sidewalls of the mandrel 40 are separated from each other by a distance that is related to the dimensions of the mandrel 40. The dimensions of the mandrel 42 may be selected to locate the different sections of the spacer 42. The dimension, w1, of the spacer 42 is less than the dimension, w2, between the sidewall spacers 18 on adjacent gate structures 22.

Figure 4:
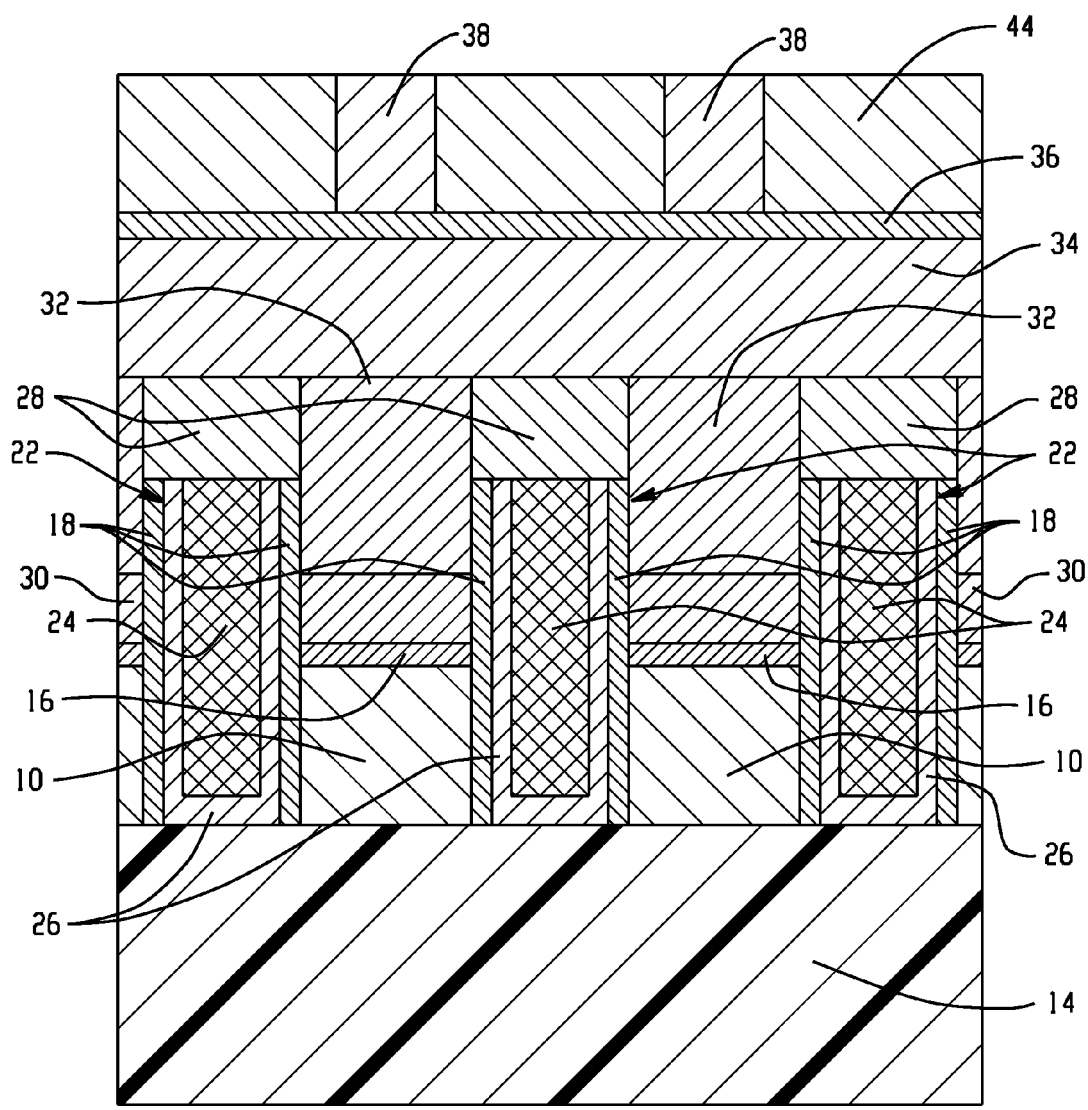

With reference to FIG. 4 in which like reference numerals refer to like features in FIG. 3 and at a subsequent fabrication stage, the mandrel 40 is selectively removed relative to the spacer 42 using an etching process with a suitable etch chemistry. After the mandrel 40 is removed, an etching process is applied to pattern the hardmask layer 38 by removing portions of the hardmask layer 38 that are not masked by the spacer 42. The etching process may be selected to stop on the hardmask layer 36. Following the patterning, complementary portions of the hardmask layer 38 are located at the masked positions underneath the spacer 42, which maintains the pattern established by the spacer 42. Consequently, the pattern characterizing the spacer 42 is transferred to the hardmask layer 38.

A sacrificial layer 44 of a material, such as amorphous carbon, is deposited and planarized with, for example, CMP. The planarization removes the spacer 42 and stops on the material of the hardmask layer 38. The sacrificial layer 44 and portions of the hardmask layer 38, which are complementary to the spacer 42, each contribute to define a reverse tone pattern transferred from the spacer 42. The material of the sacrificial layer 44 is selected such that the material constituting the patterned portions of the hardmask layer 38 can be selectively removed. The complementary portions of the hardmask layer 38 are embedded in the sacrificial layer 44, cross the top surface of the fin 10 at the locations of the spacer 42, and have the same dimension, w1, as the spacer 42.

Figure 5:
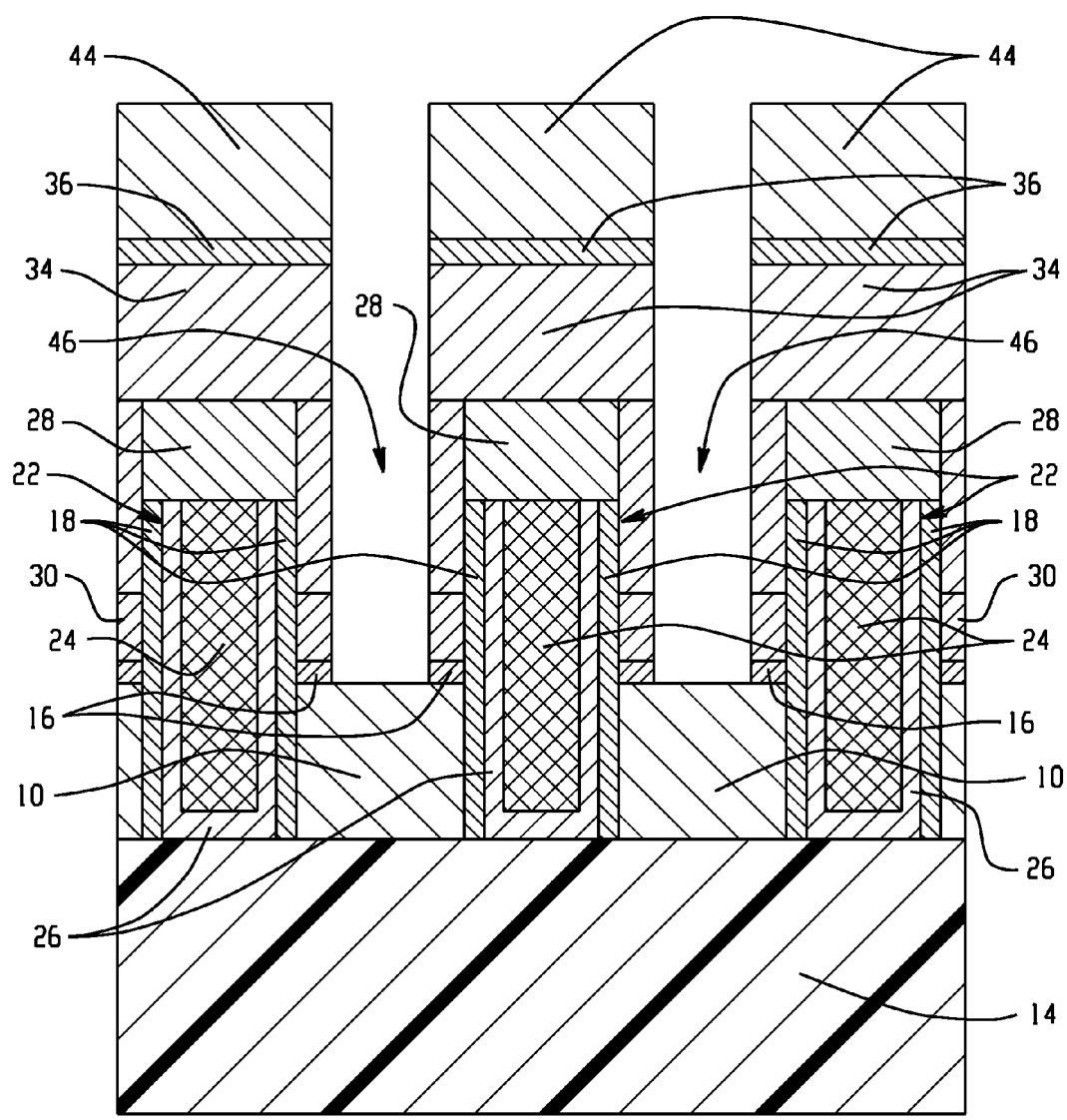

With reference to FIG. 5 in which like reference numerals refer to like features in FIG. 4 and at a subsequent fabrication stage, the portions of the hardmask layer 38 resulting from the patterning with masking provided by the spacer 42 are removed selective to the sacrificial layer 44 to form openings 46 in the sacrificial layer 44. This removal forms a reverse tone mask relative to the spacer 42 used to pattern the hardmask layer 38. The openings 46 are then extended through the respective constituent materials of hardmask layers 34, 36, and then as contact holes 46 extending through the constituent material of the dielectric layer 32 stopping on the sacrificial layer 30. The contact holes 46 are further extended vertically into the material of the sacrificial layer 30 using an etching process with a suitable chemistry and stopping on the material of the CESL 16. The CESL 16 is removed over the area exposed by the contact holes 46 from the top surface of the fin 10 using an etching process with a suitable chemistry and stopping on the semiconductor material of the fin 10.

The contact holes 46 are smaller in dimensions (i.e., width) than what can be achieved with conventional patterning as a result of the self-aligned double patterning (SADP) process used in their formation. The upper section of the contact holes 46 in the dielectric layer 32 are spaced from the gate structures 22 by intervening portions of dielectric layer 32 and the sidewall spacers 18 such that the gate structures 22 are unlikely to be damaged when the contact holes 46 are extended in depth to the location of the sacrificial layer 30. In particular, the sidewall spacers 18 and caps 28 are not eroded by the etching process forming contact holes 46 due to the dimensions and alignment of the contact holes 46. This protection of the gate structures 22 during etching may be effective to increase yield and to reduce the risk of shorting between the contacts and gate structures that may potentially result from erosion.

Figure 6:
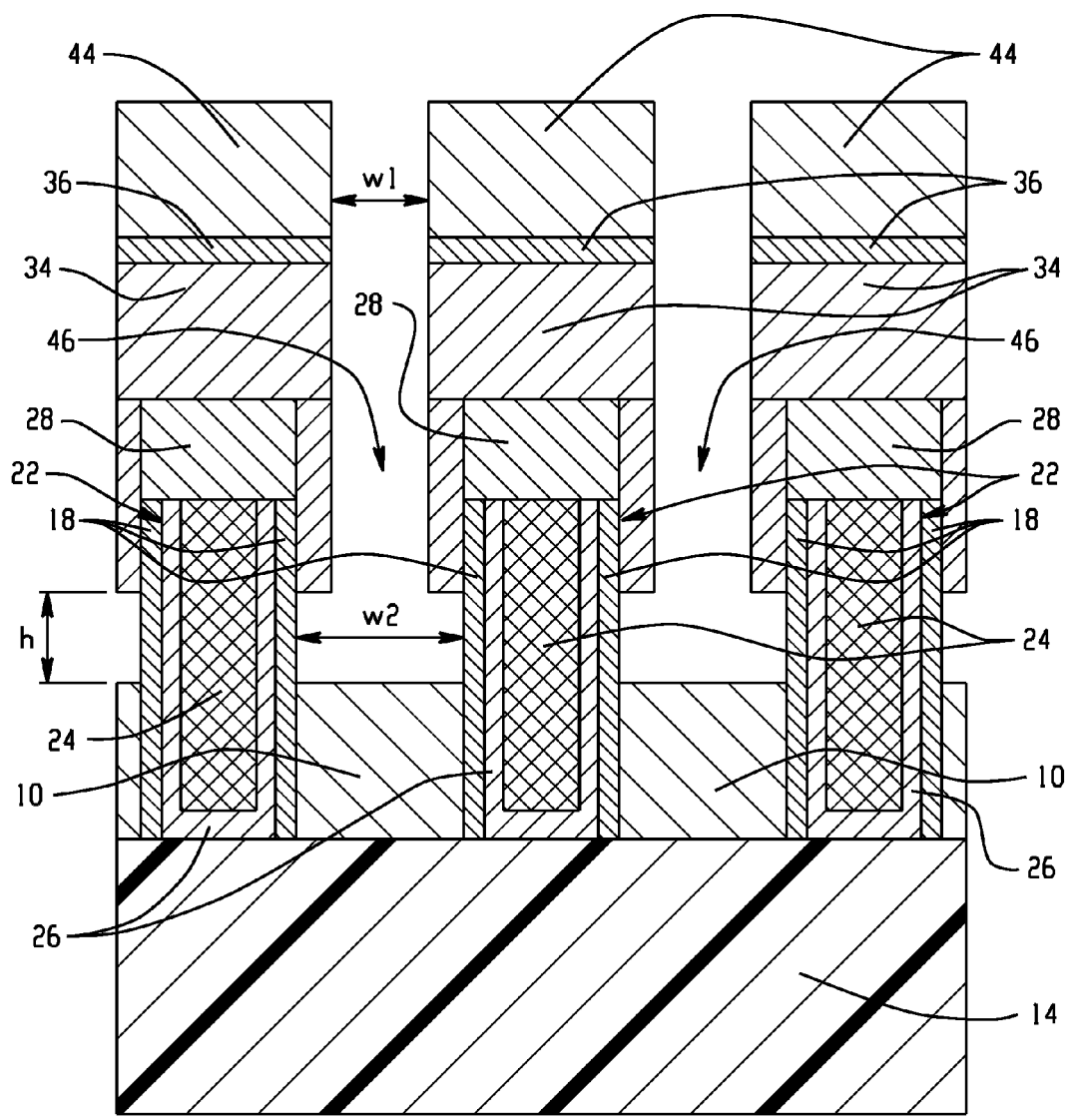

With reference to FIG. 6 in which like reference numerals refer to like features in FIG. 5 and at a subsequent fabrication stage, the remainder of the sacrificial layer 30 is removed from beneath the dielectric layer 32 using a non-directional etching process, which removes the sacrificial layer 30 selective to the constituent materials of dielectric layer 32, CESL 16 and the sidewall spacers 18. The remainder of the CESL 16 is removed from the top surface of the fin 10 using an etching process with a suitable chemistry and stopping on the semiconductor material of the fin 10. After these etching processes, the top surface of the fin 10 is cleared for silicidation and contact formation.

The removal of the sacrificial layer 30 operates to locally widen a lower section of each of the contact holes 46 between a bottom surface of the dielectric layer 32 and the top surface of the fin 10 over the height, h. The sections of the contact holes 46 that extend through the dielectric layer 32 are not widened and retain the width, w1. The contact holes 46 at the former location of the removed sacrificial layer 30 have the dimension, w2, which is equal to the distance between the sidewall spacers 18 on adjacent gate structures 22. The contact holes 46 effectively have an inverted T-shape with a section of smaller width over the thickness of the dielectric layer 32 and a section of a larger width beneath the dielectric layer 32 and above the top surface of the fin 10. The section of each contact hole 46 having the width, w2, also has a height, h, that is equal to the sum of the thicknesses of the CESL 16 and sacrificial layer 30 that were removed from the gaps. The height, h, of each contact hole 46 is less than the height of the gate structures 22, either with or without the caps 28, when measured relative to the same plane, such as a plane containing the top surface of the substrate 14.

The larger opening width at the top surface of the fin 10 vertically between the dielectric layer 32 and the fin 10 increases the available surface area for trench silicide formation and the subsequent landing of contacts formed inside the contact holes 46. In contrast with the larger opening width near the top surface of the fin 10, the smaller opening width within the thickness of the dielectric layer 32 operates to reduce parasitic capacitance in addition to operating to reduce the risk of shorting between contacts inside the contact holes 46 and the gate structures 22.

Figure 7:
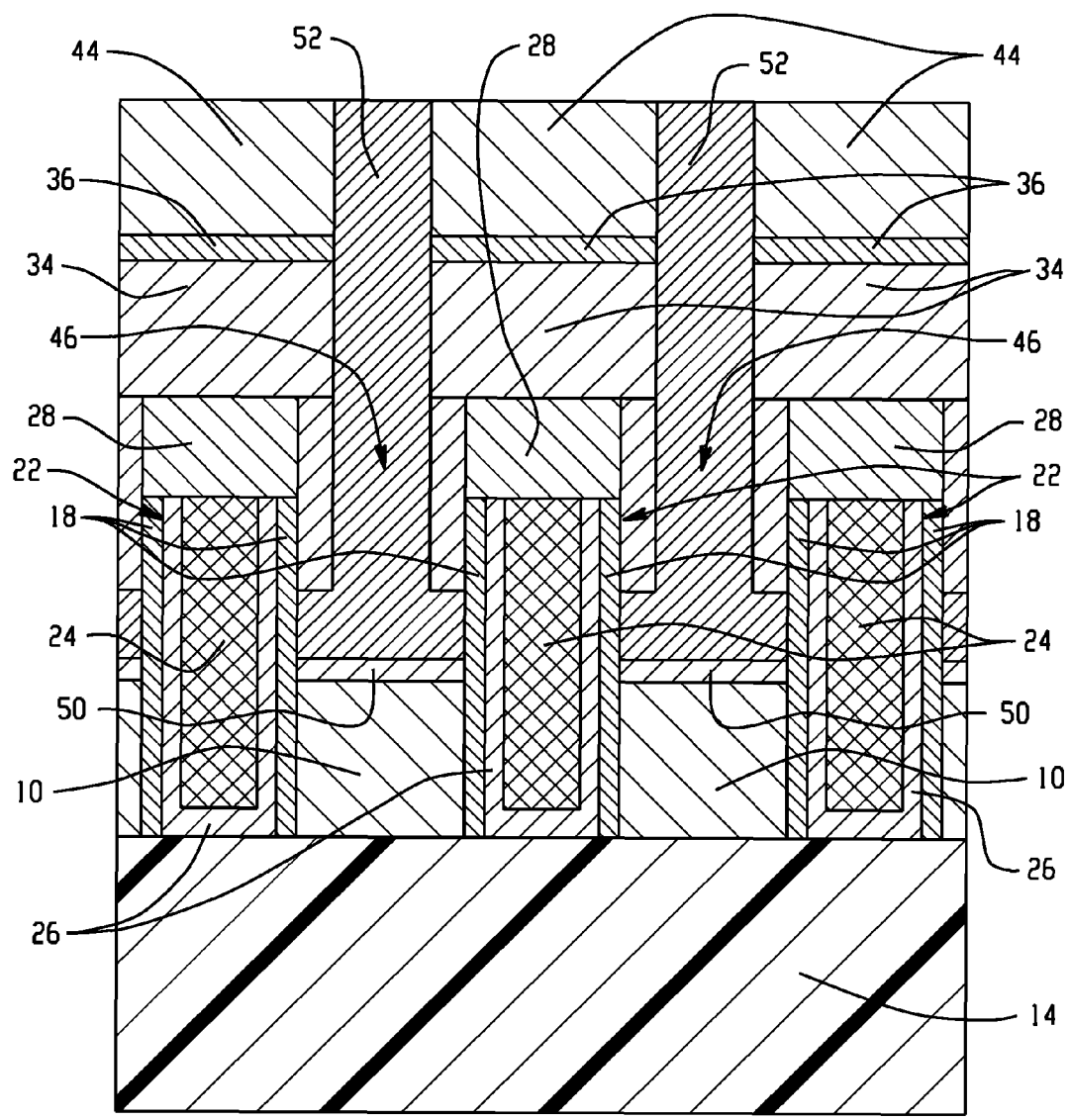

With reference to FIG. 7 in which like reference numerals refer to like features in FIG. 6 and at a subsequent fabrication stage, sections of a silicide layer 50 are formed on the top surface of the fin 10. The silicide layer 50 may be formed by a silicidation process that involves one or more annealing steps to form a silicide phase by reacting a layer comprised of a silicide-forming metal and the semiconductor material at the top surface of the fin 10 contacting the silicide-forming metal. Candidate materials for the silicide-forming metal include, but are not limited to, cobalt (Co) and nickel (Ni).

Contacts 52 are formed in the contact holes 46 and are coupled by the sections of the silicide layer 50 with the top surface of the fin 10. The contacts 52 adopt the shape of the contact holes 46, and thereby have the dimension, w1, within the layers 32, 34 and the dimension, w2, at a location that is in direct contact with the silicide layer 50. The contacts 52 may be comprised of a metal, such as tungsten (W), that is deposited as a layer by, for example, physical vapor deposition and then planarized with, for example, CMP to remove excess metal from the top surface of sacrificial layer 44. A liner (not shown) comprised of titanium (Ti), titanium nitride (TiN), tantalum (Ta), tantalum nitride (TaN), or a layered combination of these materials (e.g., a bilayer of TaN/Ta) may be applied to the surfaces bordering the contact holes 46 before the contacts 52 are formed.

Back-end-of-line (BEOL) processing follows, which may include formation of additional dielectric layers, via plugs, and wiring for an interconnect structure having wires coupled by the contacts 52 with the fin 10, as well as other contacts that are coupled with the gate structures 22.

Figure 8:
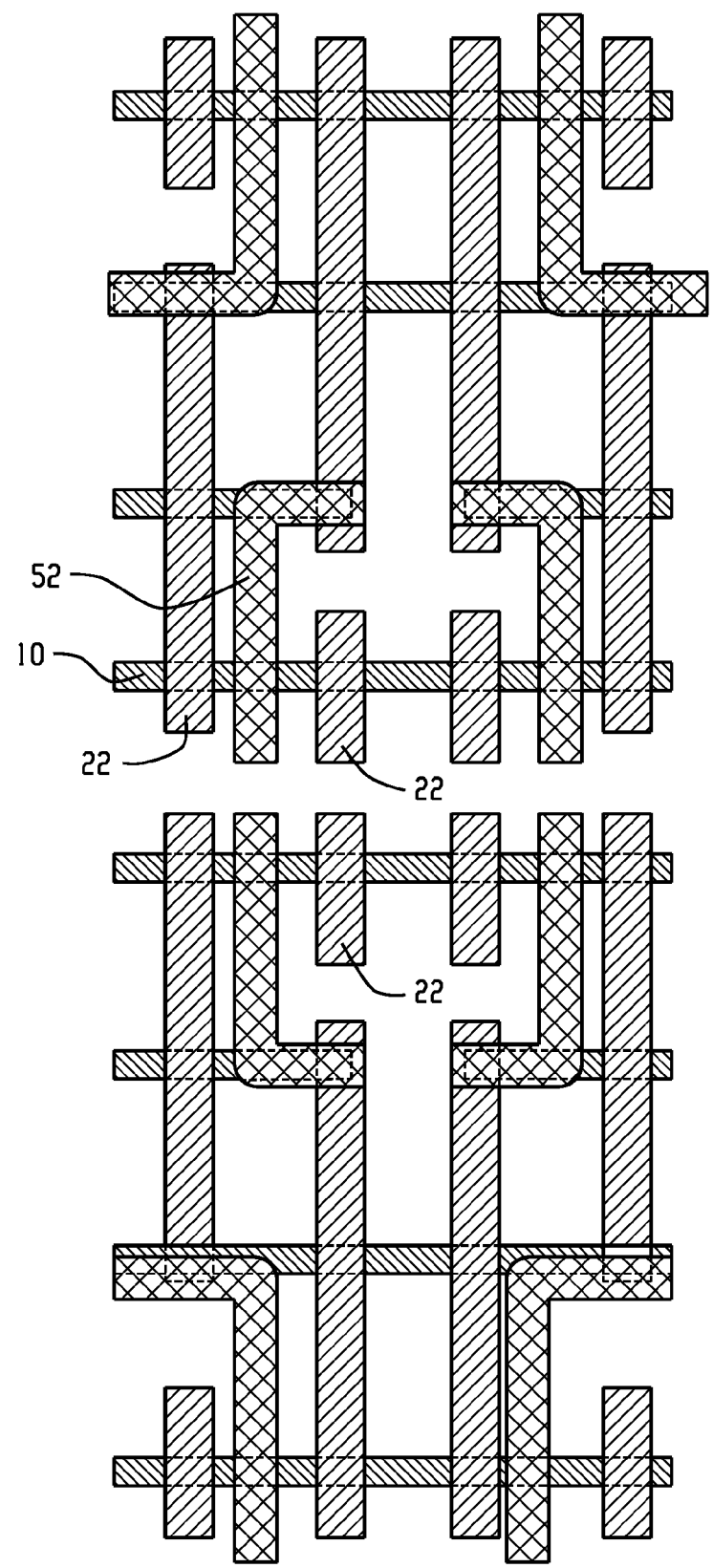
FIG. 8 is a diagrammatic top view of a structure with contacts formed in accordance with embodiments of the invention.

With reference to FIG. 8 in which like reference numerals refer to like features in FIG. 7 and in accordance with embodiments of the invention, the contacts 52 may be used to cross couple fin-type field-effect transistors in a static random-access memory (SRAM). The spacer 42 (FIG. 3), which determines the shape of each contact 52, conforms to the two-dimensional shape of the mandrel 40. The spacer 42 changes direction by 90° at each corner of the mandrel 40. The shape of the spacer 42 is reproduced in the shape of the openings the contact hole 46, which includes corners at the locations of the corners of the spacer 42. As a result, each contact 52 includes one of the corners when adopting the two-dimensional shape of the contact hole 46. In a conventional process flow in which one-dimensional linear contacts are formed, a separate connecting section of a conductor is separately formed as an additive structure to the linear contact in order to provide the two-dimensional shape that is needed to provide the change in direction and promote cross-coupling. Consequently, a benefit of the two-dimensional shape of the contacts 52 is that the separate connecting section does not need to be separately formed as done in the conventional process flow.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first gate structure and a second gate structure separated from the first gate structure by a space that crosses over a top surface of a fin;
    forming a first sacrificial layer within the space adjacent to the top surface of the fin;
    forming a dielectric layer within the space above the sacrificial layer;
    forming a hardmask layer on the dielectric layer;
    forming an opening in the hardmask layer at a location that is above the top surface of the fin and between the first gate structure and the second gate structure;
    forming a first section of a contact hole in the dielectric layer at the location of the opening, wherein the first section of the contact hole extends through the dielectric layer to the sacrificial layer;
    after the first section of the contact hole is formed, removing the first sacrificial layer selective to the dielectric layer to form a second section of the contact hole between the dielectric layer and the top surface of the fin, wherein the second section of the contact hole extends through the first sacrificial layer to expose the top surface of the fin; and
    forming a contact in the contact hole that is coupled with the top surface of the fin,
    wherein the second section of the contact hole is located between a sidewall spacer on the first gate structure and a sidewall spacer on the second gate structure, and the first section of the contact hole is narrower than a distance between the sidewall spacer on the first gate structure and the sidewall spacer on the second gate structure.

2. The method of claim 1 wherein the second section of the contact hole is wider than the first section of the contact hole.

3. The method of claim 1 wherein the first gate structure and the second gate structure each have a cap, and the first section of the contact hole is separated from the cap on the first gate structure and the cap on the second gate structure by a portion of the dielectric layer.

4. The method of claim 1 further comprising:
    removing an interlayer dielectric from the space between the first gate structure and the second gate structure,
    wherein the dielectric layer and the sacrificial layer are formed in the space after the interlayer dielectric is removed.

5. The method of claim 1 forming the opening in the hardmask layer at the location that is above the top surface of the fin and between the first gate structure and the second gate structure comprises:
    forming a second sacrificial layer on the dielectric layer;
    forming a mandrel on the second sacrificial layer;
    forming a spacer on a sidewall of the mandrel; and
    after the spacer is formed, removing the mandrel selective to the spacer.

6. The method of claim 5 further comprising:
    etching the second sacrificial layer using the spacer as an etch mask to form a portion of the second sacrificial layer;
    depositing a third sacrificial layer in which the portion of the second sacrificial layer is embedded; and
    after the third sacrificial layer is deposited, removing the spacer.

7. The method of claim 6 further comprising:
    after the spacer is removed, removing the portion of the second sacrificial layer to define an opening in the third sacrificial layer.

8. The method of claim 7 wherein forming the opening in the hardmask layer at the location that is above the top surface of the fin and between the first gate structure and the second gate structure further comprises:
    etching the hardmask layer at the location of the opening in the third sacrificial layer to define the opening in the hardmask layer.

9. The method of claim 1 further comprising:
    forming a silicide layer on the top surface of the fin,
    wherein the silicide layer couples the top surface of the fin with the contact.

* * * * *